(12) United States Patent
Brown et al.

(10) Patent No.: US 7,019,530 B1
(45) Date of Patent: Mar. 28, 2006

(54) METHOD OF SURFACE PREPARATION AND IMAGING FOR INTEGRATED CIRCUITS

(75) Inventors: Terrence Harold Brown, Harwood, MD (US); Larry Gene Ferguson, Baltimore, MD (US)

(73) Assignee: The United States of America as represented by the National Security Agency,, Washington, DC (US)

( * ) Notice: Subject to any disclaimer, the term of this patent is extended or adjusted under 35 U.S.C. 154(b) by 0 days.

(21) Appl. No.: 11/020,961

(22) Filed: Dec. 20, 2004

(51) Int. Cl.
*G01R 31/00* (2006.01)
*G01R 31/26* (2006.01)

(52) U.S. Cl. ............. 324/501; 324/538; 324/750; 324/765; 438/14; 438/16; 438/17; 438/57; 438/107; 438/118

(58) Field of Classification Search ............ 438/59; 324/542
See application file for complete search history.

(56) References Cited

U.S. PATENT DOCUMENTS

| | | | |
|---|---|---|---|
| 4,680,635 A | 7/1987 | Khurana | |
| 6,107,107 A | 8/2000 | Bruce et al. | |
| 6,338,974 B1 | 1/2002 | Strnad | |
| 6,366,101 B1 * | 4/2002 | Bruce | 324/752 |
| 6,650,130 B1 | 11/2003 | Kash et al. | |

\* cited by examiner

*Primary Examiner*—Ha Nguyen
*Assistant Examiner*—Cheung Lee
(74) *Attorney, Agent, or Firm*—Jennifer P. Ferragut

(57) ABSTRACT

The present invention is a method of surface preparation and imaging for integrated circuits. First, a substrate is selected and an opening is cut in the substrate of a sufficient size to fit an integrated circuit to be analyzed. A second substrate is then selected. An adhesive film is applied to the top surface of the first substrate, the adhesive film having adhesive on both sides and covering the opening on the first substrate. An integrated circuit is then inserted into the opening and attached to the bottom side of the adhesive film. Next, the first substrate and integrated circuit are bonded to the second substrate using the adhesive film. The bottom side of the first substrate and the integrated circuit are then thinned until the substrate wafer of the integrated circuit is completely removed. The bottom side of the first substrate and integrated circuit is then thinned to a user-definable level. A handle wafer is then attached to the bottom side of the first substrate. The second substrate is then removed and thinned and an analytical imaging technique is performed on the integrated circuit from the top side of the first substrate. The first substrate and integrated circuit are optionally repeatedly destructively processed to a user-definable level. Processing and imaging steps are repeated as desired on this user-definable level preferably down to just one level.

25 Claims, 5 Drawing Sheets

METHOD OF SURFACE PREPARATION AND IMAGING FOR INTEGRATED CIRCUITS

FIELD OF INVENTION

This invention relates to a semiconductor device manufacturing process and, more specifically, to a semiconductor device manufacturing process with measuring of electrical characteristics of the semiconductor.

BACKGROUND OF THE INVENTION

Integrated circuit analysis imaging techniques are frequently used during failure analysis of semiconductor devices. Methods for performing this analysis include collection and analysis of emitted radiation, electron microscopy, and conventional optical imaging. The image derived from the analysis method chosen can be examined to determine several characteristics of the invention, which makes the processes especially useful for reverse engineering, failure analysis, and operational analysis. Typically, when the object of the imaging technique is reverse engineering the front side of the integrated circuit is processed and imaged.

Front side imaging allows enhanced viewing of the interconnects, which generally reside on the substrate at the lowest level of the chip. Because the interconnects are a frequent source of failure in an integrated circuit, the ability to clearly view the interconnects greatly reduces the number of defective parts distributed by a manufacturer. It also allows simpler and more accurate failure analysis during the testing phases of product development. Additionally, backside processing provides a clearer view of the components of the integrated circuit as the interconnects do not obscure the view of the electronic components as severely as the components obscure the view of the interconnects in frontside imaging. This again results in more accurate failure and operational analysis.

U.S. Pat. No. 4,680,635, entitled "EMISSION MICROSCOPE," discloses a device for providing high sensitivity viewing of semiconductors. With the device, a first illuminated top view is taken of a selected portion of the semiconductor. After the image is taken, the illumination is removed and background noise light is collected to create a background image. A voltage is then applied to the device causing leakage current to be conducted through any defects of the semiconductor. This leakage will emit weak visible light and infrared light, which is amplified and captured a second illuminated image. The background image is subtracted from the second illuminated image to produce an improved image, which is superimposed over the first image. This superimposed image is used for failure or operational analysis of the semiconductor. The analysis techniques employed in this patent differ from the method of the present application. U.S. Pat. No. 4,680,635 is hereby incorporated by reference into the specification of the present invention.

U.S. Pat. No. 6,107,107, entitled "ANALYZING AN ELECTRONIC CIRCUIT FORMED UPON A FRONTSIDE SURFACE OF A SEMICONDUCTOR SUBSTRATE BY DETECTING RADITATION EXITING A BACKSIDE SURFACE COATED WIH AN ANTIREFLECTIVE MATERIAL," discloses an imaging system that detects electromagnetic radiation emanating from the backside surface of an integrated circuit. The backside surface is coated with an antireflective coating, a beam of electromagnetic radiation is directed to the backside surface or electrical power is supplied to the circuit, and the radiation emanated from the backside is collected. The emitted radiation is used to analyze the circuit. This method of analysis is not used in the present invention. U.S. Pat. No. 6,107,107 is hereby incorporated by reference into the specification of the present invention.

U.S. Pat. No. 6,338,974, entitled "INTEGRATED CIRCUIT ANALYTICAL IMAGING TECHNIQUE EMPLOYING A BACKSIDE SURFACE FILL LAYER," discloses a method of processing a backside of an integrated circuit to allow analysis of the circuit. With this method, the backside of the circuit is thinned, resulting in a thin semiconductor substrate having peaks and valleys. A fill material is applied to the thin substrate to at least partially fill the valleys. The result is a smother substrate surface. This surface is imaged using any conventional radiation emission imaging technique. The present invention does not use this method for backside imaging. U.S. Pat. No. 6,338,974 is hereby incorporated by reference into the specification of the present invention.

U.S. Pat. No. 6,650,130, entitled "INTEGRATED CIRCUIT DEVICE DEFECT DETECTION METHOD AND APPARATUS EMPLOYING LIGHT EMISSION IMAGING," discloses a method of detecting defects in integrated circuits by providing electrical power to the circuits and recording the images generated by the light emitted from the circuits due to the application of power. Prior to providing power to the integrated circuits, the backside of the circuits may be thinned and polished if necessary to allow the electrical signals to be transmitted to the integrated circuit. The present invention does not operate in this manner. U.S. Pat. No. 6,650,130 is hereby incorporated by reference into the specification of the present invention.

The difficulty in performing failure analysis or reverse engineering on an integrated circuit is obtaining a clear view of the components of the circuit. To achieve this, most modern systems attempt to obtain a clear image of the top side of the integrated circuit through light emission or a combination of optically obtained images and emitted images. These procedures are extremely costly. Additionally, emitted images often result in a shadowing effect caused by the activation of the interconnect structures and active structures during the application of power or heating of the semiconductor during the imaging process. Surface and subsurface charging cause shadowing. This shadow effect causes blurring around the images under test, and may ultimately obscure portions of the final image. This can cause inaccuracies in the final reading. In the case of reverse engineering this is extremely problematic as the shadows make it difficult to see the overall construction of the device. Moreover, conventional analysis techniques are generally limited to only one imaging method for the integrated circuit. It is therefore desirable in the art to have a simple, cost-effective top side imaging process that allows a clear image to be obtained of the components of an integrated circuit by a variety of imaging methods.

SUMMARY OF THE INVENTION

It is an object of the present invention to provide a semiconductor analysis technique that allows a clear image of the components of an integrated circuit to be obtained.

It is a further object of the present invention to provide a semiconductor analysis technique that allows a clear image of the components of an integrated circuit to be obtained from the top side of an integrated circuit device after backside processing.

It is a further object of the present invention to provide a semiconductor analysis technique that allows a clear image of the components of an integrated circuit to be obtained from the top side of an integrated circuit device after backside processing and that allows analysis by multiple conventional imaging techniques.

The present invention is a method of surface preparation and imaging of integrated circuits. The first step of the method is selecting a first substrate.

The second step of the method is cutting an opening in the first substrate. The opening matches the size of an integrated circuit to be analyzed according to the method. The integrated circuit includes a substrate wafer, at least one interconnect, and at least one electronic device.

The third step of the method is selecting a second substrate.

The fourth step of the method is applying an adhesive film to the first substrate. The adhesive film covers the opening in the first substrate and has adhesive on both sides.

The fifth step of the method is inserting the integrated circuit into the opening in the first substrate.

The sixth step of the method is attaching the integrated circuit to the bottom side of the adhesive film.

The seventh step of the method is bonding the first substrate and the integrated circuit to the second substrate. The bonding is achieved by sandwiching the adhesive film between the first substrate and integrated circuit and the second substrate.

The eighth step of the method is thinning the bottom side of the first substrate and the integrated circuit such that the substrate wafer of the integrated circuit is removed.

The ninth step of the method is applying an adhesive film to the bottom side of the first substrate.

The tenth step of the method is bonding the first substrate and the integrated circuit to a handle substrate.

The eleventh step of the method is removing the second substrate.

The twelfth step of the method is performing an analytical imaging technique on the integrated circuit.

The thirteenth step of the method is destructively processing the first substrate and integrated circuit until a user-definable portion of the integrated circuit has been removed.

The fourteenth step of the method is performing an analytical imaging technique on the top side of the integrated circuit.

The fifteenth step of the method is repeating the thirteenth step and fourteenth step according to user preferences.

DETAILED DESCRIPTION OF THE PREFERRED EMBODIMENTS

Figure 1:
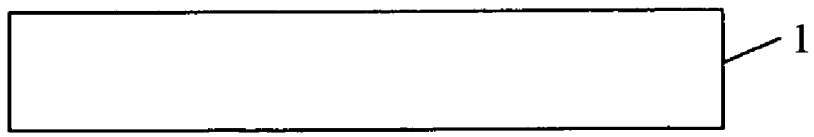
FIG. 1 is a cross-sectional view of a device having been processed according to the first step of the method.

The present invention is a method of surface preparation and imaging of integrated circuits. The first step is selecting a first substrate 1, as shown in FIG. 1. The first substrate is composed of a suitable rigid material, many of which are well known and commonly used in the art, but is preferably a silicon wafer. As would be obvious to one of skill in the art, any other suitable substrate material could be used, such as such as quartz, polysilicon, silicon-on-insulator, or gallium arsenide. In a preferred embodiment the substrate is composed of silicon and has a diameter of approximately 152 mm.

Figure 2:
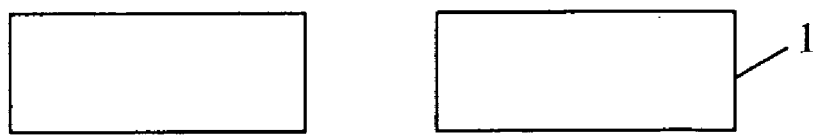
FIG. 2 is a cross-sectional view of a device having been processed according to the second step of the method.

The second step of the method is cutting an opening in the first substrate 1. A cross-sectional view of the first substrate 1 having an opening is shown in FIG. 2. The opening matches the size of an integrated circuit to be analyzed according to the method. As is well known to those skilled in the art, integrated circuits typically include a substrate wafer, such as a silicon substrate, upon which the components of the integrated circuit are mounted, grown, or etched. Electronic components included on the substrate wafers are generally connected by metal structures commonly known to those skilled in the art as interconnects. In the preferred embodiment, the integrated circuit includes a substrate wafer, at least one interconnect, and at least one electronic device. The opening in the first substrate 1 is dimensioned to fit the integrated circuit. In the preferred embodiment, the outer dimensions of the integrated circuit will match the inner dimensions of the opening such that there will be a close fit between the two if the integrated circuit is housed in the opening. The substrate wafer and the first substrate 1 are preferably composed of the same material.

Figure 3:
FIG. 3 is a cross-sectional view of a device having been processed according to the third step of the method.
Figure 3:

The third step of the method is selecting a second substrate 2. A cross-sectional view of a device according to this step of the method is shown in FIG. 3. The second substrate 2 is preferably constructed of the same material as the first substrate 1 and the substrate wafer of the integrated circuit, and further has approximately the same dimensions as the first substrate 1 prior to the cutting of the opening in the second step of the method. As with the first substrate 1, the second substrate 2 may be composed of any other suitable rigid material, many of which are well known and commonly used in the art, such as such as quartz, polysilicon, silicon-on-insulator, or gallium arsenide. The second substrate preferably has a diameter of approximately 152 mm and a thickness of approximately 500 um.

Figure 4:
FIG. 4 is a cross-sectional view of a device having been processed according to the fourth step of the method.
Figure 4:

With reference to FIG. 4, the fourth step of the method is applying an adhesive film 3 to the first substrate 1. The adhesive film 3 is preferably a double sided adhesive film 3 applied to the top side of the first substrate 1. In the preferred embodiment the adhesive film 3 covers the entire surface of the top side of the first substrate 1, however in all embodiments the adhesive film 3 must cover the opening in the first substrate 1. The adhesive film 3 is preferably a commercially available double-sided tape, such as acrylic glue, but may be any suitable adhesive film, many of which are well-known and commonly used in the art. Additionally, an adhesive may be applied to the entire bottom surface of the second substrate 2. This obviates the need of covering the hole in the first substrate 1 as all elements would contact the bottom surface of the second substrate 2 during fabrication, as will become obvious with reference to the description below.

Figure 5:
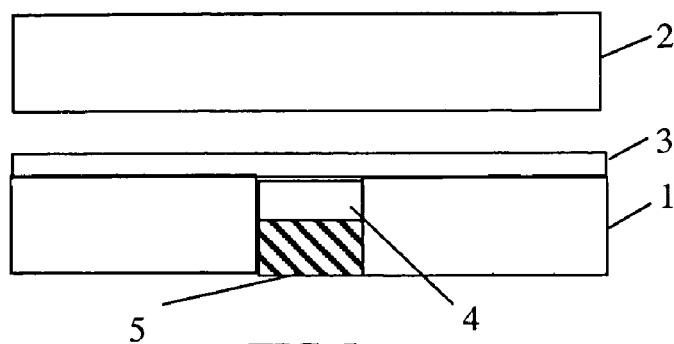
FIG. 5 is a cross-sectional view of a device having been processed according to the fifth step of the method.

With reference to FIG. 5, the fifth step 5 of the method is inserting an integrated circuit 4 into the opening in the first substrate 1. The integrated circuit 4 is inserted into the opening of the first substrate 1 face down such that the substrate wafer 5 of the integrated circuit 4 is in contact with the bottom side of the first substrate 1. Correspondingly, when viewing the top side of the first substrate 1 the electronic components of the integrated circuit 4 will be visible through the opening after insertion of the integrated circuit 4 into the opening. In the preferred embodiment, the integrated circuit 4 is aligned with the bottom side of the first substrate 1 such that the substrate wafer 5 and the bottom side of the first substrate 1 form a smooth surface. The height of the integrated circuit 4 is preferably equal to the thickness of the first substrate 1, such that after insertion the top of the integrated circuit 4 will be even with the top side of the first substrate 1 and the bottom of the integrated circuit 4 will form a smooth surface with the bottom side of the first substrate 1. Because the top of the integrated circuit 4 includes a number of distinct electronic components, a smooth surface will not be formed along the top side of the first substrate 1, though the top of the integrated circuit 4 and the top side of the first substrate 1 preferably lie in the same horizontal plane.

The sixth step of the method is attaching the integrated circuit 4 to the bottom side of the adhesive film 3. As was explained in detail earlier, an adhesive film 3 is preferably attached to the top side of the first substrate 1. After inserting the integrated circuit 4 into the opening in the first substrate 1, the integrated circuit 4 is attached face down to the adhesive film 3. The method of attachment will depend on the type of adhesive used, as would be obvious to one of skill in the art. In the preferred embodiment, the integrated circuit 4 is attached to the adhesive film 3 by applying pressure to the bottom side of the first substrate 1 and substrate wafer 5 in the direction of the adhesive film and to the top side of the adhesive film 3 in the direction of the integrated circuit 4. Heat may additionally be applied, depending on the adhesive used. If adhesive is placed on the bottom side of the second substrate 2, as opposed to the top side of the first substrate 1, this step is omitted.

Figure 6:
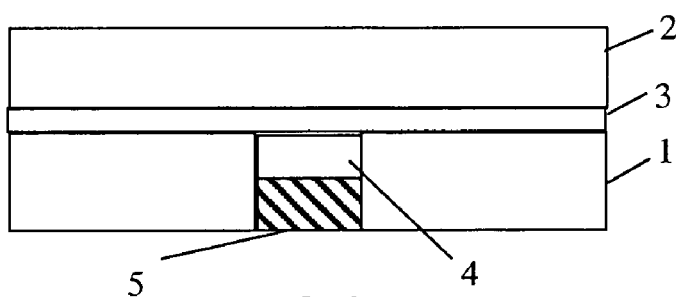
FIG. 6 is a cross-sectional view of a device having been processed according to the seventh step of the method.

With reference to FIG. 6, the seventh step 7 of the method is bonding the first substrate 1 and integrated circuit 4 to the second substrate 2. The first substrate 1, second substrate 2 and adhesive film 3 are bonded via the adhesive film 3 applied to the first substrate 1 in the fourth step of the method. To bond the two substrates and the integrated circuit 4, the second substrate 2 is preferably brought into contact with the adhesive film 3 and pressure is placed on the first substrate 1, the second substrate 2 and the integrated circuit 4, until the substrates are attached. The attachment method will be discussed in greater detail with reference to FIG. 12. If an adhesive is placed on the bottom side of the second substrate 2, as opposed to using an adhesive film 3, the method of bonding will vary with the adhesive used. For example, if the bottom side of the second substrate 2 is coated with a glue, the top side of the first substrate 1 and the top side of the integrated circuit 4 may be pressed against the bottom side of the second substrate 2 until the components are bonded. Many methods of bonding components are well known to those of skill in the art, and any method could be used in place of the preferred method that would allow the integrated circuit 4 to be closely fit within the opening in the first substrate 1 and further allow both the first substrate 1 and integrated circuit 4 to be firmly attached to the second substrate 2.

Figure 12:
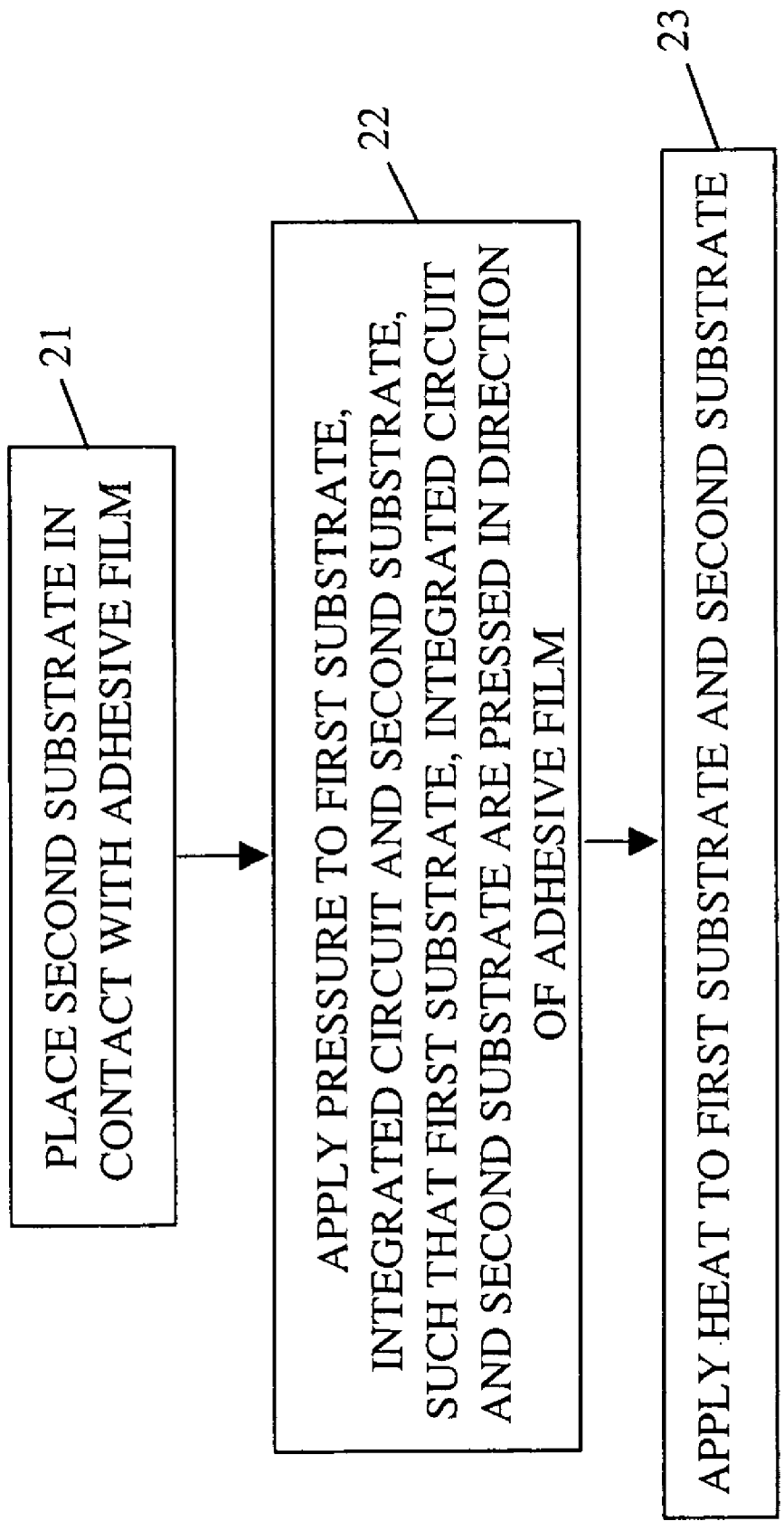
FIG. 12 is a flow chart detailing the steps of the seventh step of FIG. 1.

FIG. 12 is a list of steps to bond the first substrate 1 and integrated circuit 4 to the second substrate 2 according to the seventh step of the method. The first step 21 of the bonding method is placing the second substrate 2 in contact with top side of the adhesive film 3. As was explained in greater detail earlier, the adhesive film 3 is applied to the top side of the first substrate 1 and includes adhesive on both sides. In the first step of the method, the bottom side of the second substrate 2 is brought into contact with the top side of the adhesive film 3 such that the bottom side lies flat along the entire surface of the top side of the adhesive film 3.

The second step 22 of the bonding method is applying pressure to the first substrate 1, the second substrate 2 and the integrated circuit 4 such that the first substrate 1, the second substrate 2 and the integrated circuit 4 are pressed in the direction of the adhesive film 3. As was explained in greater detail above, the adhesive film 3 includes adhesive on both its top side and its bottom side. The top side of the first substrate 1 and the integrated circuit 4 are in contact with the bottom side of the adhesive film 3. The bottom side of the second substrate 2 is in contact with the top side of the adhesive film 3. In the construction described above, the adhesive film 3 is sandwiched between the first substrate 1 and integrated circuit 4 and the second substrate 2. The elements are initially bonded together by applying pressure from the outside of these elements inward such that the adhesive on the top side and bottom side of the adhesive film 3 bonds to the corresponding surfaces of the first substrate 1, integrated circuit 4 and second substrate 2.

The third step 23 of the bonding method is applying heat to the first substrate 1 and the second substrate 2. In the preferred embodiment heat is applied to the first substrate 1 and the second substrate 2 to complete bonding of the first substrate 1 and the second substrate 2. As is well known to those skilled in the art, heat is commonly used to cure a variety of adhesives. This step may be omitted depending on the adhesive used, according to user preferences. Heat is preferably not applied to the integrated circuit, as this may cause damage to the circuit and may create unwanted effects in the circuit. However, heat may be applied to the integrated circuit 4 as well, according to user preferences.

Figure 7:
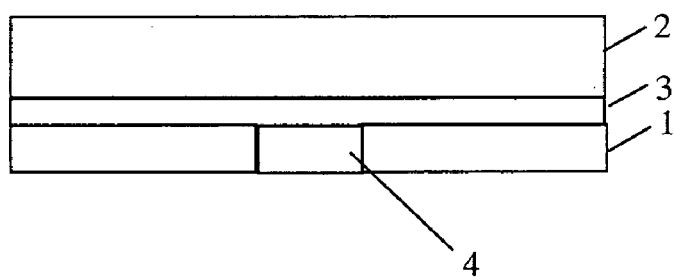
FIG. 7 is a cross-sectional view of a device having been processed according to the eighth step of the method.

As shown in FIG. 7, the eighth step of the method is thinning the bottom side of the first substrate 1 and the integrated circuit 4 to a user-definable level. Thinning the bottom side of the first substrate 1 and the substrate wafer 5 can be accomplished by a variety of methods, including grinding, lapping, and wet and dry etching. In one embodiment, the bottom side of the first substrate 1 and the substrate wafer 5 are thinned until the substrate wafer 5 is entirely removed. This will expose the interconnects and electronic components of the integrated circuit 4. In an alternative embodiment, the bottom side of the first substrate 1 and the integrated circuit 5 are thinned until the level of the integrated circuit 4 is reached that will be examined using the analysis technique of the present invention that will be explained in greater detail below. Because an integrated circuit 4 includes several layers of circuitry, this would involve thinning the integrated circuit 4 from the bottom side to remove all layers of circuitry beneath the layer of circuitry to be analyzed. An advantage to this method of processing is that removal of the substrate deactivates the interconnects, eliminating the shadowing effect described in greater detail above. This allows for far more effective analysis of the integrated circuit 4.

Figure 13:
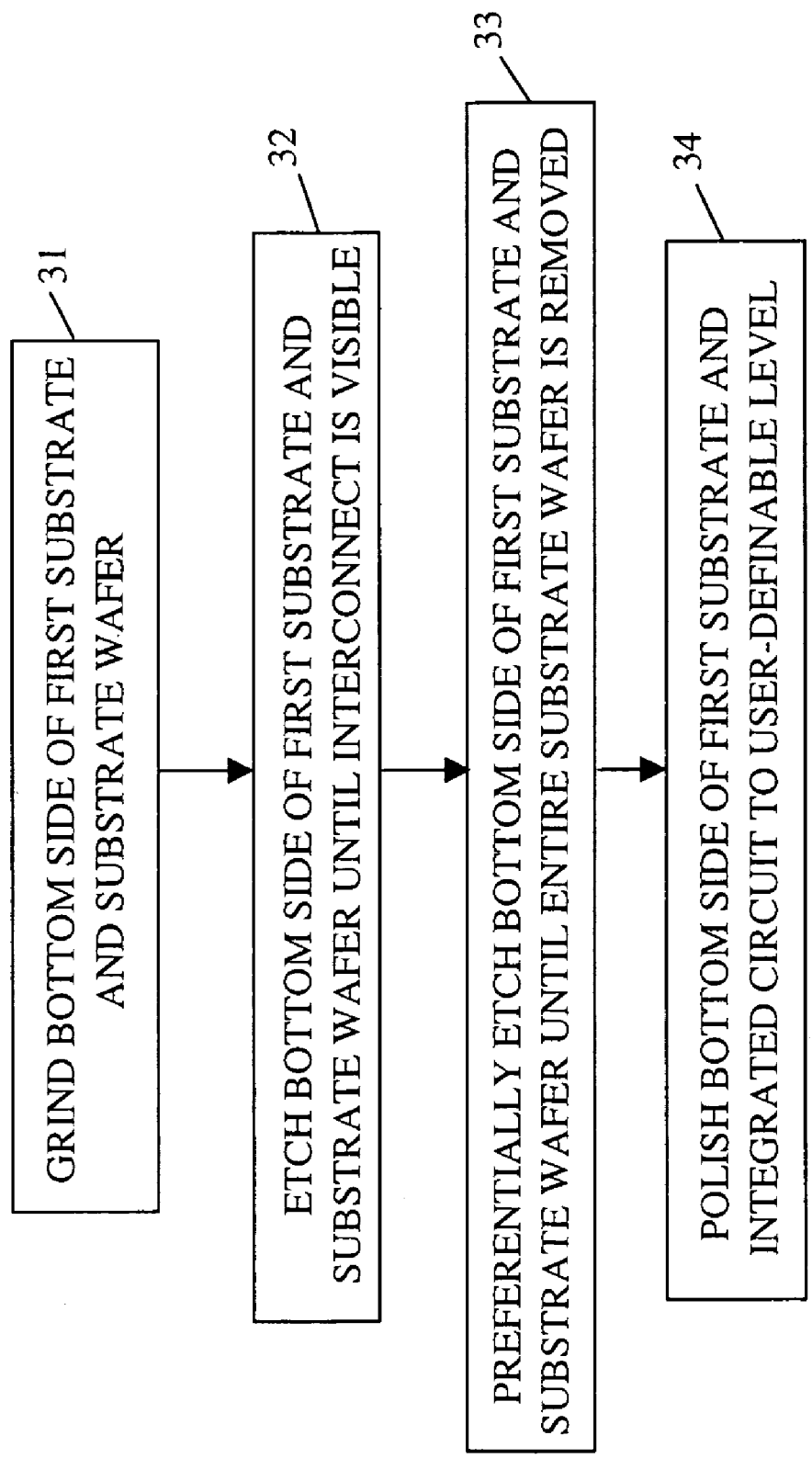
FIG. 13 is a flow chart detailing the steps of the eighth step of FIG. 1.

FIG. 13 is a list of steps to thin the bottom side of the first substrate and the substrate wafer according to the eighth step of the method. The first step of the thinning method 31 is grinding the bottom side of the first substrate 1 and the substrate wafer 5 of the integrated circuit 4. The grinding process is performed until only a thin layer of the substrate wafer 5 remains, preferably leaving the integrated circuit 4 having a height of approximately 75 um. Because of the destructive nature of the grinding process, grinding is halted prior to exposure of the interconnects or other electronic components of the integrated circuit 4 to prevent damage to the integrated circuit 4 and allow accurate analysis after processing.

The second step 32 of the thinning method is etching the bottom side of the first substrate 1 and the substrate wafer 5 until at least one interconnect is visible. Etching consists of removing the substrate wafer 5 through application of a chemical. With wet etching, a liquid is applied to the substrate wafer 5 and the substrate wafer 5 is dissolved. With dry etching, the substrate wafer 5 is converted into a gaseous compound through the application of a chemical or physical process. In the preferred embodiment, the substrate wafer 5 and first substrate 1 are wet etched until the components of the integrated circuit 4 appear through the substrate wafer 5. The thickness of the first substrate 1 and integrated circuit 4 at this point is preferably approximately 10 um. The etching process is stopped when the interconnects of the integrated circuit 4 are partially visible.

The third step 33 of the thinning method is preferentially etching the bottom side of the first substrate 1 and the substrate wafer 5 until the entire substrate wafer 5 is removed. The substrate wafer 5 is preferably removed using a selective etch process. The selective etch process preferably comprises immersing the first substrate 1 and substrate wafer 5 in a chemical that selectively etches the material that composes the first substrate 1 and substrate wafer 5 until the entire substrate wafer 5 is removed from the integrated circuit 4. As would be obvious to one of skill in the art, the specific chemical used for this selective etch will depend on the material used for the first substrate 1 and the substrate wafer 5. Methods of performing a selective etch, and chemicals used for the process, are well known to those of skill in the art, and any appropriate methods and chemicals may be used in conjunction with the present invention. After removal of the substrate wafer 5, the first substrate 1 and integrated circuit 4 preferably have a thickness of approximately 2.5 um. After removal of the entire substrate wafer 5, the components of the integrated circuit 4 are visible when viewing the first substrate 1 from the bottom side.

The fourth step 34 of the method is polishing the bottom side of the first substrate 1 and the integrated circuit 4 to a user-definable level. This step is performed only if the user wishes to thin the integrated circuit to a single level to be analyzed, as was described in greater detail above. As is obvious to those of skill in the art, polishing is a very precisely controllable destructive process commonly used in the semiconductor industry. Because each layer of the integrated circuit 4 is approximately 10–12 microns or less, a polishing process is preferred when removing layers of the integrated circuit 4. Methods of polishing substrates and integrated circuits are well known to those skilled in the art, and any conventional method could be used in conjunction with this invention. Additionally, though polishing is used in the preferred embodiment, any other suitable destructive processing technique could be used to thin the first substrate 1 and integrated circuit 4 to a user-definable level.

Figure 8:
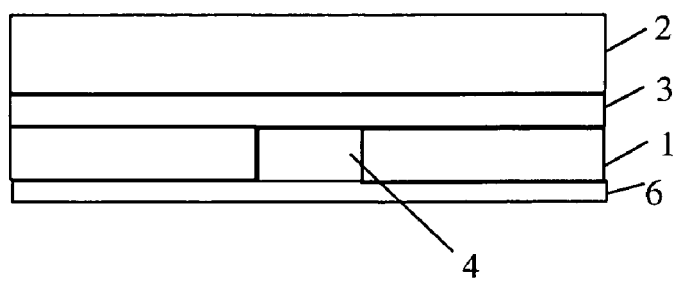
FIG. 8 is a cross-sectional view of a device having been processed according to the ninth step of the method.

With reference to FIG. 8, the ninth step of the method is applying a second adhesive film 6 to the bottom side of the first substrate 1. The second adhesive film 6 covers the opening in the first substrate 1 and has adhesive on both sides. As was explained in detail with reference to the application of the adhesive film 3 in the fourth step of the method, applying the second adhesive film 6 to the first substrate 1 preferably consists of covering the entire surface of the bottom side of the first substrate 1. Alternatively, the second adhesive film 6 may cover only the opening in the first substrate 1 that houses the integrated circuit 4. The second adhesive film 6 is preferably a commercially available double-sided tape, such as acrylic glue, but may be any suitable adhesive film, many of which are well-known and commonly used in the art. Additionally, an adhesive may be applied to the entire top surface of a handle substrate 7, which will be explained in greater detail below. This obviates the need of covering the hole in the first substrate 1 as all elements would contact the top surface of a handle substrate 7 during fabrication.

Figure 9:
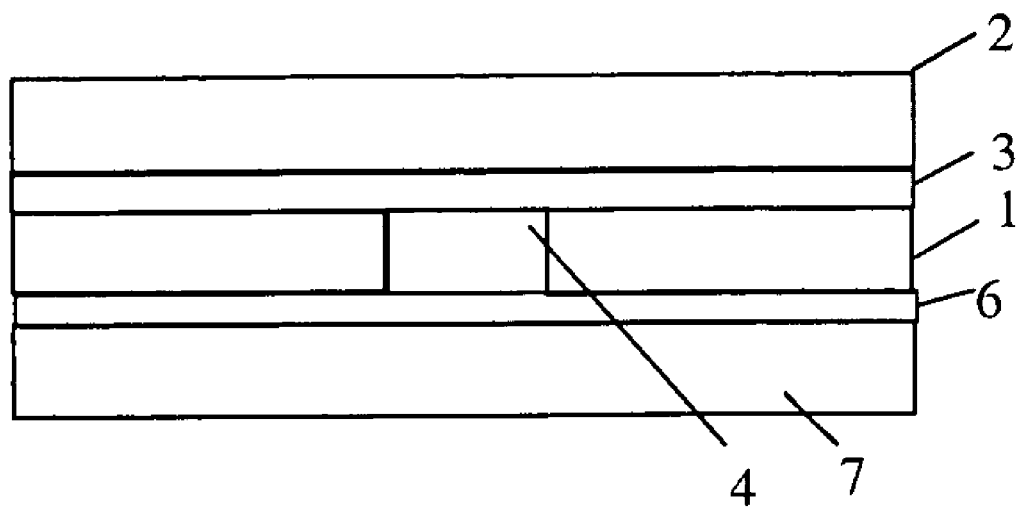
FIG. 9 is a cross-sectional view of a device having been processed according to the tenth step of the method.

With reference to FIG. 9, the tenth step 10 of the method is bonding the first substrate 1 and the integrated circuit 4 to a handle substrate 7. The bonding is achieved by sandwiching the second adhesive film 6 between the first substrate 1 and integrated circuit 4 and the handle substrate 7. The handle substrate 7 is preferably constructed of the same material as the first substrate and the second substrate 2, and further has approximately the same dimensions as the second substrate 2. As with the second substrate 2, the handle substrate 7 may be composed of any other suitable rigid material, many of which are well known and commonly used in the art, such as such as quartz, polysilicon, silicon-on-insulator, or gallium arsenide. The second substrate 2 preferably has a diameter of approximately 152 mm and a thickness of approximately 500 um. The first substrate 1, handle substrate 7 and integrated circuit 4 are bonded via the second adhesive film 6 applied to the first substrate 1 in the ninth step of the method. To bond the two substrates and the integrated circuit 4, the handle substrate 7 is preferably brought into contact with the second adhesive film 6 and pressure is placed on the first substrate 1, the handle substrate 7 and the integrated circuit 4, until the substrates are attached. The same attachment method that was discussed in detail with reference to FIG. 2 is preferably used to bond the substrates in the tenth step of the method. If an adhesive is placed on the top surface of the handle substrate 7, as opposed to using an adhesive film, the method of bonding will vary with the adhesive used. For example, if the top surface of the handle substrate 7 is coated with a glue, the bottom side of the first substrate 1 and the bottom side of the integrated circuit 4 may be pressed against the bottom side of the handle substrate 7 until the components are bonded. Many methods of bonding components are well known to those of skill in the art, and any method could be used in place of the preferred method that would allow the integrated circuit 4 to be closely fit within the opening in the first substrate and further allow both the first substrate 1 and integrated circuit 4 to be firmly attached to the handle substrate 7.

Figure 10:
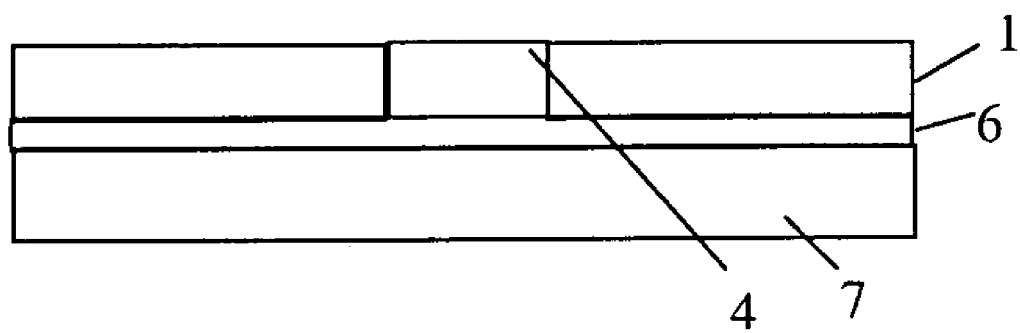
FIG. 10 is a cross-sectional view of a device having been processed according to the eleventh step of the method.

With reference to FIG. 10, the eleventh step of the method is removing the second substrate 2. Removal of the second substrate 2 may be accomplished by any conventional method, but preferably is achieved using a destructive removal method. In the preferred embodiment the second substrate 2 is removed by wet etching. The second substrate 2 is preferably thinned using a wet etching process until the first substrate 1 and integrated circuit 4 are reached. Alternatively, the first substrate 1 can be removed by immersion of the assembly in an etchant. If this method is used, a seal or protective casing is preferably placed around the first substrate 1 and integrated circuit 4 to prevent damage to these elements during removal of the second substrate 2. To remove a substrate by immersion, the necessary components are sealed and the assembly is immersed in a dump rinse tank filed with a suitable etchant until the adhesive film is dissolved, thus separating the second substrate 2 from the first substrate 1 and integrated circuit 4. The method used to separate the second substrate 2 will depend on the material used for the second substrate 2 and the adhesive film 3.

The twelfth step of the method is performing an analytical imaging technique on the integrated circuit 4. Analytical imaging of the integrated circuit 4 will preferably be performed by imaging the components of the integrated circuit 4 from the top side of the first substrate 1. This is possible because the components of the integrated circuit 4 are visible from the top side of the first substrate 1 after complete removal of the second substrate 2 and the adhesive film 3, as was explained in greater detail above with reference to the eleventh step of the method. Many analytical imaging techniques exist, as is obvious to those of skill in the art, and any conventional method may be used in conjunction with this invention. An advantage of the present invention is that, since the components are directly exposed after removal of the substrate wafer 5, one analytical imaging technique that may be used is conventional optical imaging using an optical microscope. Any additional suitable imaging technique, including scanning electron microscopy and photon emission microscopy, may also be used, as would be obvious to one of skill in the art. At this stage of the processing this step is optional. If the user wishes to only image a single level of the integrated circuit 4, analytical imaging would not be performed at this stage of the processing. With this method, the user will have thinned the layer of the integrated circuit 4 to be analyzed in the eighth step of the method, as was explained in greater detail above.

Figure 11:
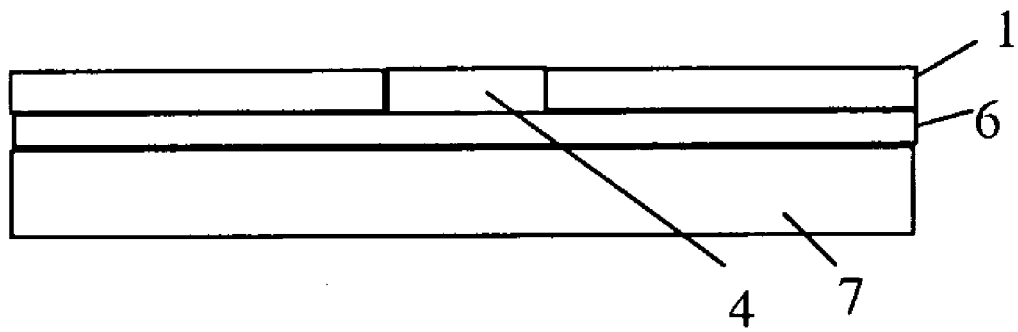
FIG. 11 is a cross-sectional view of a device having been processed according to the thirteenth step of the method.

With reference to FIG. 11, the thirteenth step of the method is destructively processing the first substrate 1 and integrated circuit 4 until a user-definable portion of the integrated circuit 4 has been removed. The integrated circuit 4 and first substrate 1 are processed using a destructive processing technique, such as polishing, to remove components from the integrated circuit 4. These components include electronic components, layers of an interconnect, and any other conventional elements of a semiconductor or integrated circuit device. In one embodiment the first substrate 1 and integrated circuit 1 are processed until the top-most layer of components are removed from the integrated circuit 4. For example, if the top-most visible components of the integrated circuit 4 are a number of optical elements, the integrated circuit 4 and first substrate 1 are preferably destructively processed until the optical elements are removed. In an alternative embodiment, if the integrated circuit 4 was thinned to a specific layer to be imaged in the eighth step of the method, the first substrate 1 and integrated circuit 4 are thinned until the layer of the integrated circuit 4 is reached. With this method, several integrated circuits can be thinned to different layers of the integrated circuit 4 and imaged separately, the separate images being analyzed together to reverse engineer the integrated circuit 4. Though the preferred method of removal is polishing, any conventional method of removal can be used in conjunction with this invention, as would be obvious to one of skill in the art.

The fourteenth step of the method is performing an analytical imaging technique on the top side of the integrated circuit 4. Analytical imaging of the integrated circuit 4 will preferably be performed by imaging the components of the integrated circuit 4 from the top side of the first substrate 1. This is possible because the components of the integrated circuit 4 are visible from the top side of the first substrate 1 after complete removal of the second substrate 2, as was explained in greater detail above with reference to the twelfth step of the method. Many analytical imaging techniques exist, as is obvious to those of skill in the art, and any conventional method may be used in conjunction with this invention. An advantage of the present invention is that, since the components are directly exposed after removal of the substrate wafer 5, one analytical imaging technique that may be used is conventional optical imaging using an optical microscope. Any additional suitable imaging technique, including scanning electron microscopy and photon emission microscopy, may also be used, as would be obvious to one of skill in the art.

The fifteenth step of the method is repeating the thirteenth step and fourteenth step according to user preferences. By repeating this process, successive layers of the integrated circuit 4 are imaged. If performing failure analysis, layers can be removed until the point of failure is determined. Even more advantageously, all layers of the integrated circuit 4 can be examined for reverse engineering. By removing subsequent layers of the integrated circuit 4, the entire structure of the integrated circuit 4 can be examined. Accurate examination of all layers of the integrated circuit 4 is essential to effective reverse engineering. Because the present invention provides for imaging using a variety of techniques, including optical imaging, it does not suffer from the drawbacks of previous inventions. Further, because the backside is processed to remove the substrate wafer 5 the shadow effects caused by prior art emission imaging systems are non-existent.

What is claimed is:

1. A method of surface preparation and imaging of integrated circuits, comprising the following steps in the recited order:
   a) selecting a first substrate having a top side and a bottom side and a thickness;
   b) cutting an opening through the entire thickness of the first substrate, wherein the opening matches the size of an integrated circuit to be analyzed, and wherein the integrated circuit includes a substrate wafer, at least one interconnect, and at least one electronic device;
   c) selecting a second substrate having a top side and a bottom side and a thickness;
   d) applying a first adhesive film having a bottom side and a top side to the top side of the first substrate, the first adhesive film covering the opening in the first substrate, and further having adhesive on both the bottom side and the top side;
   e) inserting the integrated circuit into the opening in the first substrate;
   f) attaching the integrated circuit to the bottom side of the first adhesive film;
   g) bonding the first substrate and the integrated circuit to the second substrate via the first adhesive film;
   h) thinning the bottom side of the first substrate and the integrated circuit until a user-definable portion of the integrated circuit has been removed;

i) applying a second adhesive film having a bottom side and a top side to the bottom side of the first substrate, the second adhesive film covering the opening in the first substrate, and further having adhesive on both the bottom side and the top side;

j) selecting a handle substrate having a top side and a bottom side and a thickness;

k) bonding the first substrate and the integrated circuit to the handle substrate via the second adhesive film;

l) removing the second substrate;

m) if imaging of top level of integrated circuit is required, then performing an analytical imaging technique on the top side of the integrated circuit, otherwise proceeding to step (n);

n) destructively processing the top side of the first substrate and integrated circuit until a user-definable portion of the integrated circuit has been removed;

o) performing an analytical imaging technique on the top side of the integrated circuit; and p) if further imaging is required repeating steps (n) through (o), otherwise stopping.

2. The method of claim 1, wherein the integrated circuit is inserted into the opening such that the substrate wafer of the intergrated circuit is exposed from the bottom side of the first substrate, and wherein the step of thinning the first substrate and integrated circuit further comprises the following steps in the recited order:

a) grinding the bottom side of the first substrate and the substrate wafer of the integrated circuit;

b) etching the bottom side of the first substrate and the substrate wafer until the at least one interconnect is visible;

c) preferentially etching the bottom side of the first substrate and the substrate wafer until the entire substrate wafer is removed; and d) if further processing is required, polishing the bottom side of the first substrate and the integrated circuit to a user-definable level.

3. The method of claim 2, wherein the step of destructively processing the top side of the first substrate and the integrated circuit further comprises the following steps in the recited order:

a) grinding the top side of the first substrate and the integrated circuit;

b) etching the top side of the first substrate and integrated circuit;

c) preferentially etching the top side of the first substrate and the integrated circuit; and d) if further processing is required, polishing the top side of the first substrate and the integrated circuit to a user-definable level.

4. The method of claim 3, wherein the step of bonding the first substrate and the integrated circuit to a handle substrate further comprises the steps of:

a) placing the first substrate in contact with top side of the second adhesive film;

b) applying pressure to first substrate, the handle substrate and the integrated circuit such that the first substrate, the handle substrate and the integrated circuit are pressed in the direction of the second adhesive film; and c) applying heat to the first substrate and the handle substrate.

5. The method of claim 4, wherein the step of cutting an opening in the first substrate comprises cutting an opening in the first substrate, wherein the opening matches the size of an integrated circuit to be analyzed, and wherein the integrated circuit includes a substrate wafer, at least one interconnect, and at least one electronic device, and wherein the height of the integrated circuit is equal to the thickness of the first substrate.

6. The method of claim 5, wherein the step of selecting a second substrate comprises selecting a second substrate having a top side and a bottom side and a thickness, wherein the thickness of the second substrate is equal to the thickness of the first substrate.

7. The method of claim 6, wherein the step of bonding the first substrate, the handle substrate and the integrated circuit comprises bonding the first substrate, the handle substrate and the integrated circuit, wherein the handle substrate has a top side and a bottom side and a thickness, wherein the thickness of the handle substrate is equal to the thickness of the first substrate.

8. The method of claim 7, wherein the step of selecting a second substrate comprises selecting a second substrate having a top side and a bottom side and a thickness, wherein the thickness of the second substrate is equal to the thickness of the first substrate and wherein the second substrate is composed of the same material as the first substrate.

9. The method of claim 8, wherein the step of bonding the first substrate, the handle substrate and the integrated circuit comprises bonding the first substrate, the handle substrate and the integrated circuit, wherein the handle substrate has a top side and a bottom side and a thickness, wherein the thickness of the handle substrate is equal to the thickness of the first substrate, and wherein the handle substrate is comprised of a material selected from the group of materials consisting of silicon, quartz, porous polysilicon, silicon on insulator, gallium arsenide and any other suitable material.

10. The method of claim 9, wherein the step of selecting a first substrate comprises selecting a first substrate having a top side and a bottom side and a thickness, wherein the first substrate is comprised of a material selected from the group of materials consisting of silicon, quartz, porous polysilicon, silicon on insulator, gallium arsenide and any other suitable material.

11. The method of claim 10, wherein the step of bonding the first substrate and the integrated circuit to the second substrate further comprises the steps of:

a) placing the second substrate in contact with top side of the first adhesive film;

b) applying pressure to the first substrate, the second substrate and the integrated circuit such that the first substrate, the second substrate and the integrated circuit are pressed in the direction of the first adhesive film; and c) applying heat to the first substrate and the second substrate.

12. The method of claim 11, wherein the step of performing an analytical imaging technique on the integrated circuit comprises performing an analytical imaging technique on the integrated circuit using a method chosen from the group of methods including optical microscopy, scanning electron microscopy, photon emission microscopy, and any other suitable method.

13. The method of claim 12, wherein the step of cutting an opening in the first substrate comprises cutting an opening in the first substrate comprises cutting an opening in the first substrate, wherein the opening matches the size of an integrated circuit to be analyzed, and wherein the integrated circuit includes a substrate wafer, at least one interconnect, and at least one electronic device, and wherein the height of the integrated circuit is equal to the thickness of the first substrate and the substrate wafer is composed of the same material as the first substrate.

14. The method of claim 1, wherein the step of destructively processing the top side of the first substrate and the integrated circuit further comprises the following steps in the recited order:
   a) grinding the top side of the first substrate and the integrated circuit;
   b) etching the top side of the first substrate and integrated circuit;
   c) preferentially etching the top side of the first substrate and the integrated circuit; and
   d) if further processing is required, polishing the top side of the first substrate and the integrated circuit to a user-definable level.

15. The method of claim 1, wherein the step of bonding the first substrate, the second substrate and the integrated circuit further comprises the steps of:
   a) placing the second substrate in contact with top side of the first adhesive film;
   b) applying pressure to the first substrate, the second substrate and the integrated circuit such that the first substrate, the second substrate and the integrated circuit are pressed in the direction of the first adhesive film; and
   c) applying heat to the first substrate and the second substrate.

16. The method of claim 1, wherein the step of cutting an opening in the first substrate comprises cutting an opening in the first substrate, wherein the opening matches the size of an integrated circuit to be analyzed, and wherein the integrated circuit includes a substrate wafer, at least one interconnect, and at least one electronic device, and wherein the height of the integrated circuit is equal to the thickness of the first substrate.

17. The method of claim 1, wherein the step of selecting a second substrate comprises selecting a second substrate having a top side and a bottom side and a thickness, wherein the thickness of the second substrate is equal to the thickness of the first substrate.

18. The method of claim 1, wherein the step of bonding the first substrate, the handle substrate and the integrated circuit comprises bonding the first substrate, the handle substrate and the integrated circuit, wherein the handle substrate has a top side and a bottom side and a thickness, wherein the thickness of the handle substrate is equal to the thickness of the first substrate.

19. The method of claim 1, wherein the step of selecting a second substrate comprises selecting a second substrate having a top side and a bottom side and a thickness, wherein the thickness of the second substrate is equal to the thickness of the first substrate and wherein the second substrate is composed of the same material as the first substrate.

20. The method of claim 1, wherein the step of bonding the first substrate, the handle substrate and the integrated circuit comprises bonding the first substrate, the handle substrate and the integrated circuit, wherein the handle substrate has a top side and a bottom side and a thickness, wherein the thickness of the handle substrate is equal to the thickness of the first substrate, and wherein the handle substrate is comprised of a material selected from the group of materials consisting of silicon, quartz, porous polysilicon, silicon on insulator, gallium arsenide and any other suitable material.

21. The method of claim 1, wherein the step of selecting a first substrate comprises selecting a first substrate having a top side and a bottom side and a thickness, wherein the first substrate is comprised of a material selected from the group of materials consisting of silicon, quartz, porous polysilicon, silicon on insulator, gallium arsenide and any other suitable material.

22. The method of claim 1, wherein the step of selecting a second substrate comprises selecting a second substrate having a top side and a bottom side and a thickness, wherein the second substrate is comprised of a material selected from the group of materials consisting of silicon, quartz, porous polysilicon, silicon on insulator, gallium arsenide and any other suitable material.

23. The method of claim 1, wherein the step of performing an analytical imaging technique on the integrated circuit comprises performing an analytical imaging technique on the integrated circuit using a method chosen from the group of methods including optical microscopy, scanning electron microscopy, photon emission microscopy, and any other suitable method.

24. The method of claim 1, wherein the step of bonding the first substrate and the integrated circuit to the handle substrate further comprises the steps of:
   a) placing the handle substrate in contact with top side of the second adhesive film;
   b) applying pressure to first substrate, the handle substrate and the integrated circuit such that the first substrate, the handle substrate and the integrated circuit are pressed in the direction of the second adhesive film; and
   c) applying heat to the first substrate and the handle substrate.

25. The method of claim 1, wherein the step of cutting an opening in the first substrate comprises cutting an opening in the first substrate, wherein the opening matches the size of an integrated circuit to be analyzed, and wherein the integrated circuit includes a substrate wafer, at least one interconnect, and at least one electronic device, wherein the substrate wafer is composed of the same material as the first substrate.

* * * * *